US010169360B2

(12) United States Patent
Haverkamp et al.

(10) Patent No.: US 10,169,360 B2
(45) Date of Patent: Jan. 1, 2019

(54) MIXING SOFTWARE BASED COMPRESSION REQUESTS WITH HARDWARE ACCELERATED REQUESTS

(71) Applicant: International Business Machines Corporation, Armonk, NY (US)

(72) Inventors: Frank Haverkamp, Tuebingen (DE); Anthony T. Sofia, Highland, NY (US); Joerg-Stephan Vogt, Holzgerlingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 431 days.

(21) Appl. No.: 14/938,380

(22) Filed: Nov. 11, 2015

(65) Prior Publication Data

US 2017/0132241 A1 May 11, 2017

(51) Int. Cl.
*H03M 7/30* (2006.01)
*G06F 17/30* (2006.01)
*H04L 29/06* (2006.01)

(52) U.S. Cl.
CPC ........ *G06F 17/30153* (2013.01); *H03M 7/30* (2013.01); *H04L 29/0604* (2013.01)

(58) Field of Classification Search
None
See application file for complete search history.

(56) References Cited

U.S. PATENT DOCUMENTS

| 7,051,126 | B1 | 5/2006 | Franklin |
| 7,307,552 | B2 | 12/2007 | Ma |
| 7,386,046 | B2* | 6/2008 | Fallon ................ H03M 7/30 375/240 |
| 7,987,161 | B2 | 7/2011 | Williams |
| 8,745,338 | B1* | 6/2014 | Yadav ............... G06F 17/30153 707/693 |
| 8,806,292 | B2 | 8/2014 | Biran |
| 9,355,112 | B1* | 5/2016 | Armangau ........ G06F 17/30153 |
| 2004/0103215 | A1* | 5/2004 | Ernst ................ H03M 7/30 709/247 |

(Continued)

OTHER PUBLICATIONS

Biasizzo et al., "Hardware Accelerated Compression of LIDAR Data Using FPGA Devices." Sensors 13.5 (2013): 6405-6422.

(Continued)

*Primary Examiner* — Neveen Abel Jalil
*Assistant Examiner* — Katriel Y Chiu
(74) *Attorney, Agent, or Firm* — Cantor Colburn LLP; William A. Kinnaman, Jr.

(57) ABSTRACT

A computer program product for data compression is provided. The computer program product includes a computer readable storage medium having program instructions embodied therewith. The program instructions are readable and executable by a processing circuit to cause the processing circuit to execute software compression for first requests for data compression that have respective sizes below a predefined threshold, forward second requests for data compression having respective sizes above the predefined threshold to a hardware accelerator and maintain a persistence of a compression dictionary used for executing the second requests across executions of the first and second requests.

9 Claims, 6 Drawing Sheets

(56) References Cited

U.S. PATENT DOCUMENTS

| | | | |
|---|---|---|---|
| 2005/0210151 A1* | 9/2005 | Abdo | H03M 7/30 |
| | | | 709/247 |
| 2009/0055587 A1 | 2/2009 | Kellar | |
| 2014/0201174 A1* | 7/2014 | Kirazci | G06F 17/30153 |
| | | | 707/693 |
| 2014/0223029 A1* | 8/2014 | Bhaskar | H03M 7/3088 |
| | | | 709/247 |

OTHER PUBLICATIONS

Franaszek et al., "On internal organization in compressed random-access memories." IBM Journal of Research and Development 45.2 (2001): 259-270.

Lee et al., . "FlashBench: A workbench for a rapid development of flash-based storage devices." Rapid System Prototyping (RSP), 2012 23rd IEEE International Symposium on. IEEE, 2012; 7 pages.

Park et al., "Compression support for flash translation layer." Proceedings of the International Workshop on Software Support for Portable Storage. 2010; 6 pages.

List of IBM Patents or Patent Applications Treated as Related; (Appendix P), Filed Mar. 17, 2016; 2 pages.

Frank Haverkamp, "Mixing Software Based Compression Requests With Hardware Accelerated Requests", U.S. Appl. No. 15/073,124, filed Mar. 17, 2016.

* cited by examiner

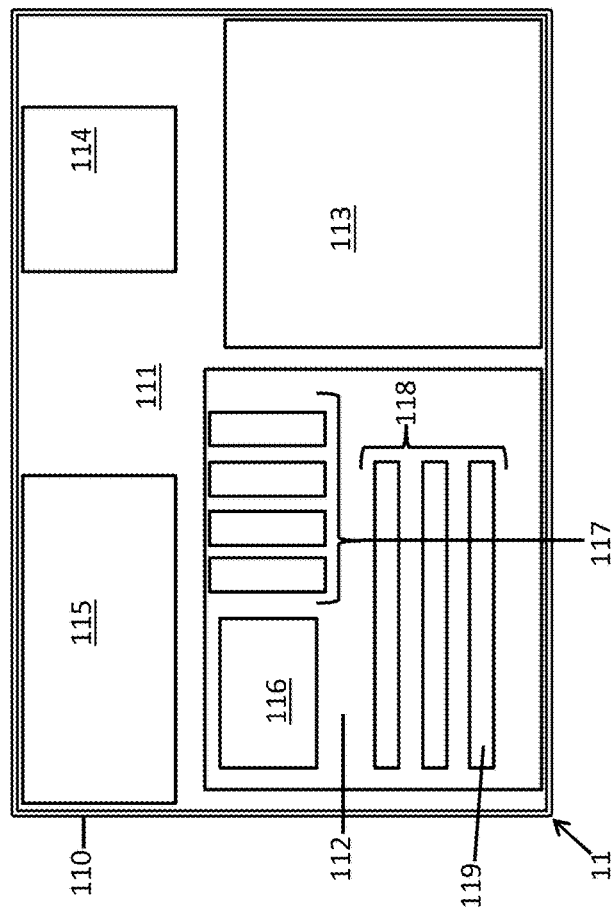
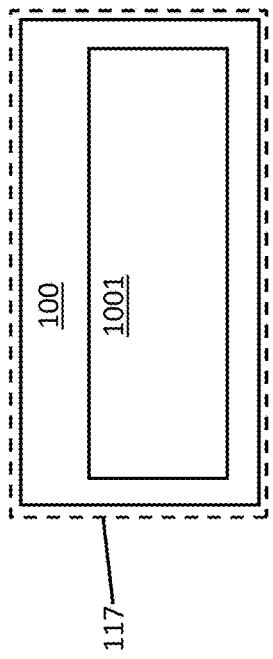

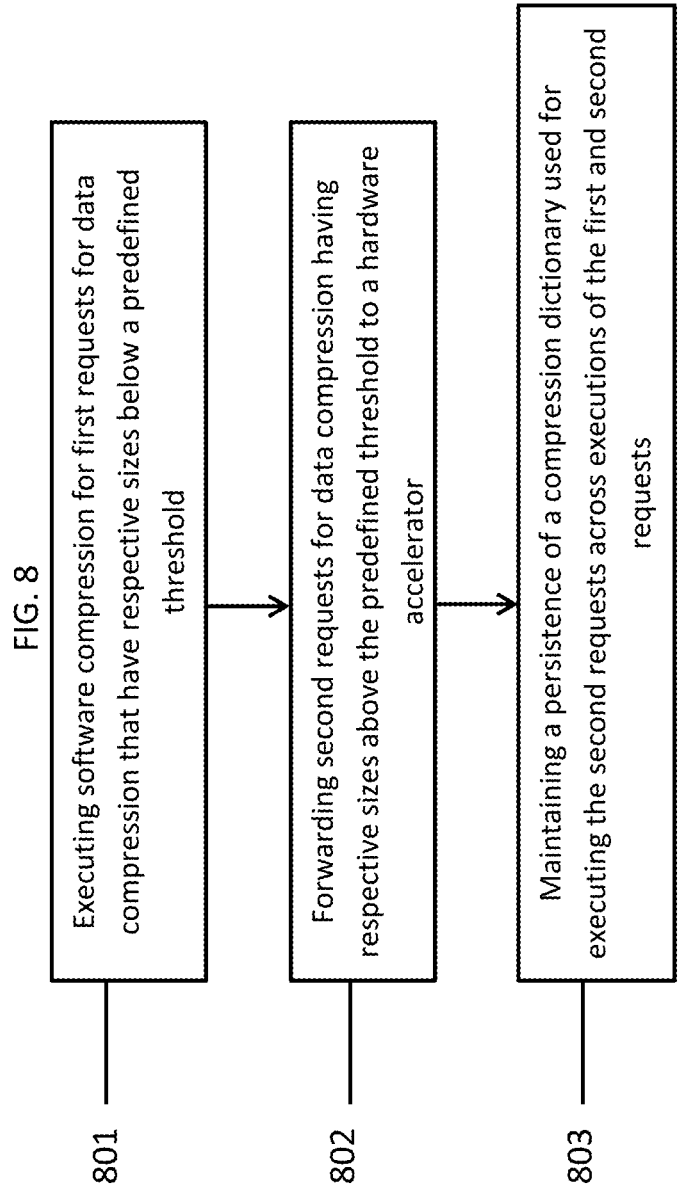

MIXING SOFTWARE BASED COMPRESSION REQUESTS WITH HARDWARE ACCELERATED REQUESTS

BACKGROUND

The present invention relates to accelerated compression requests and, more specifically, a process for mixing software based compression requests with hardware accelerated requests for a single file.

There is an industry wide direction to introduce specialized hardware accelerators for central processing unit (CPU) intensive functions, some of which include data compression operations. Devices of this nature are more valuable if they can be transparently integrated into existing workloads and applications.

In order to provide for transparent integration of hardware accelerators, some issues need to be addressed. First is that the hardware accelerators will have different latency and speed attributes for compression than performances of compression operations in pure software. One of these speed attributes could be the overhead in communicating with the device. That is, due to this potential overhead there will be a minimum size of data which will need to be provided in order to amortize that overhead. Ideally any software package would provide large amounts of input per request. There are conditions however, due to protocol or data format standards, where large requests will be intermixed with very small requests that typically carry metadata information about the payload. In this environment, use of hardware accelerators for both large and small requests will impact the overall performance of a compression operation of a single file.

The zlib open source library provides the standard programming interface for using the DEFLATE compression file format. The IBM zEnterprise Data Compression (zEDC) support extended the zlib library to use either its existing software interfaces or the new zEDC hardware to perform compression. Today, the determination to use either the software or hardware compression is made on a per-file basis based on the size of the first request for that file. This method has two shortfalls. The first of these shortfalls is that the request may be very small but may be followed by many large requests. The second shortfall is that the first request may be very large and followed by or intermixed with many very small requests. In both of these cases the existing support cannot use the hardware acceleration to achieve the best possible throughput for compressing the file.

SUMMARY

According to an embodiment of the present invention, a computer program product for data compression is provided. The computer program product includes a computer readable storage medium having program instructions embodied therewith. The program instructions are readable and executable by a processing circuit to cause the processing circuit to execute software compression for first requests for data compression that have respective sizes below a predefined threshold, forward second requests for data compression having respective sizes above the predefined threshold to a hardware accelerator and maintain a persistence of a compression dictionary used for executing the second requests across executions of the first and second requests.

According to another embodiment of the present invention, a computer system for data compression is provided. The computer system includes a computer readable storage medium having instructions stored thereon that are executable by a processing circuit to cause the processing circuit to execute software compression for first requests for data compression that have respective sizes below a predefined threshold, forward second requests for data compression having respective sizes above the predefined threshold to a hardware accelerator and maintain a persistence of a compression dictionary used for executing the second requests across executions of the first and second requests.

According to yet another embodiment of the present invention, a computer-implemented method for data compression is provided and includes executing software compression for first requests for data compression that have respective sizes below a predefined threshold, forwarding second requests for data compression having respective sizes above the predefined threshold to a hardware accelerator and maintaining a persistence of a compression dictionary used for executing the second requests across executions of the first and second requests.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 2 is a schematic diagram of an interior of a computing device;

FIG. 3 is a schematic drawing of a computer program product;

FIG. 8 is a flow diagram illustrating a computer-implemented method of data compression.

DETAILED DESCRIPTION

As will be described below, a computer program product, a computing system and a computer-implemented method are provided that mix the use of hardware and software compression capabilities for a single file request while maintaining an opacity of the software compression function (e.g., the existing zlib library) with respect to the hardware approach. This allows for a robust implementation as well as the ability to extend the support to other libraries.

Figure 1:
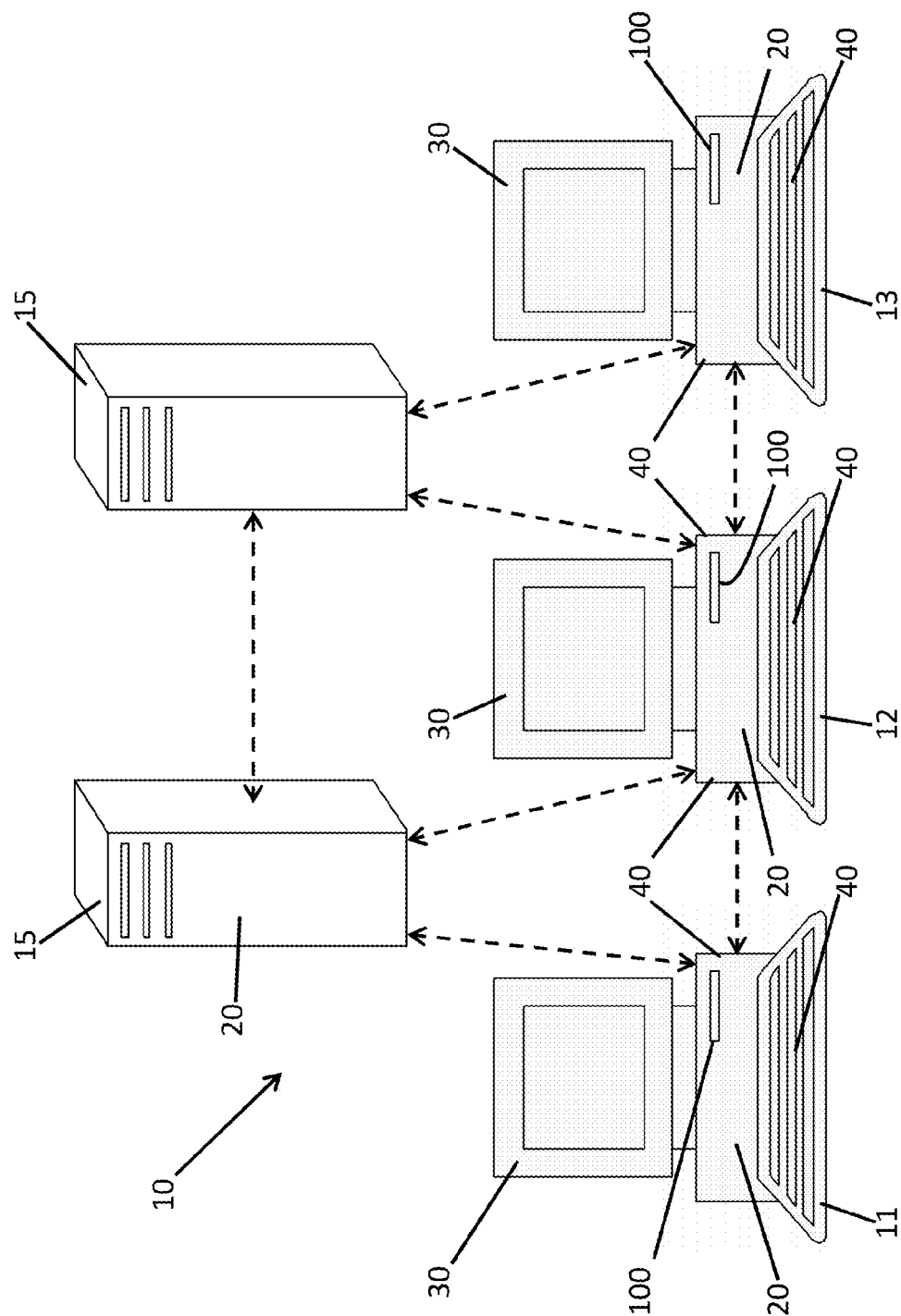
FIG. 1 is a schematic illustration of a computing system.

With reference to FIG. 1, a computing system 10 is provided and may be configured for example as an enterprise computing system or as a personal computing system. In either case, the first computing system 10 includes first, second and third computing devices 11, 12 and 13 and servers 15 which are configured to be networked together for communication purposes. Each of the first, second and third computing devices 11, 12 and 13 and the servers 15 may include among other features a processing circuit 20, a display 30, user input devices 40 and a networking unit as well as a computer program product 100 for data compression. The processing circuit 20 may be provided as a micro-processor, a central processing unit (CPU) or any other suitable processing device. The display 30 may be provided as a monitor and is configured to display data and information as well as a graphical user interface to an administrator or user. The user input devices 40 may be provided as a mouse and a keyboard combination and are configured to allow the administrator or user to input commands to the processing circuit 20. The networking unit may be provided as an Ethernet or other suitable networking device by which the first, second and third computing devices 11, 12 and 13 and servers 15 are communicative.

With reference to FIG. 2, a structure and an interior of one of the computing devices 11, 12 and 13 and the servers 15 are illustrated. For the purposes of clarity and brevity, the structure and the interior will be that of the computing device 11 although it is to be understood that any of the computing devices 11, 12 and 13 and the servers 15 could have been chosen for discussion. As shown in FIG. 2, the computing device 11 includes a housing 110 having a bottom portion, sidewalls and a lid formed to define an interior 111. The computing device 11 further includes a motherboard 112, a hard disk drive (HDD) 113, a fan 114 for generating a cooling air flow in the interior 111 and a power supply unit 115 for providing power to the computing device 11. A central processing unit (CPU) 116, a memory unit 117 and at least one or more removable cards 118 are operably installed on the motherboard.

It is to be understood that the at least one or more removable card 118 may be installed/soldered onto a same or a different motherboard as the CPU 118.

The at least one or more removable cards 118 may include, for example, a hardware accelerator card 119, a graphics processing unit (GPU) and/or a field programmable gate array (FPGA). However, for purposes of clarity and brevity it is to be understood that the following description relates to the case where the at least one more removable cards 118 is the hardware accelerator card 119.

The hardware accelerator card 119 serves as computer hardware that performs some functions (e.g., data compression) faster than software running on the CPU 116. In any case, the hardware accelerator card 119 is configured to handle certain types of data compression requests and, in particular, may be configured and disposed to handle relatively large data compression requests and to do so at a relatively high level of efficiency. That is, a throughput of the hardware accelerator card 119 is or may be substantially higher than that of the CPU 116 for a similar data compression execution. This efficiency is important to note because there are time and processing costs associated with sending data compression requests to the hardware accelerator card 119 from the CPU 116. These time and processing costs are amortized over the time required to execute the relatively large data compression requests.

Figure 4:
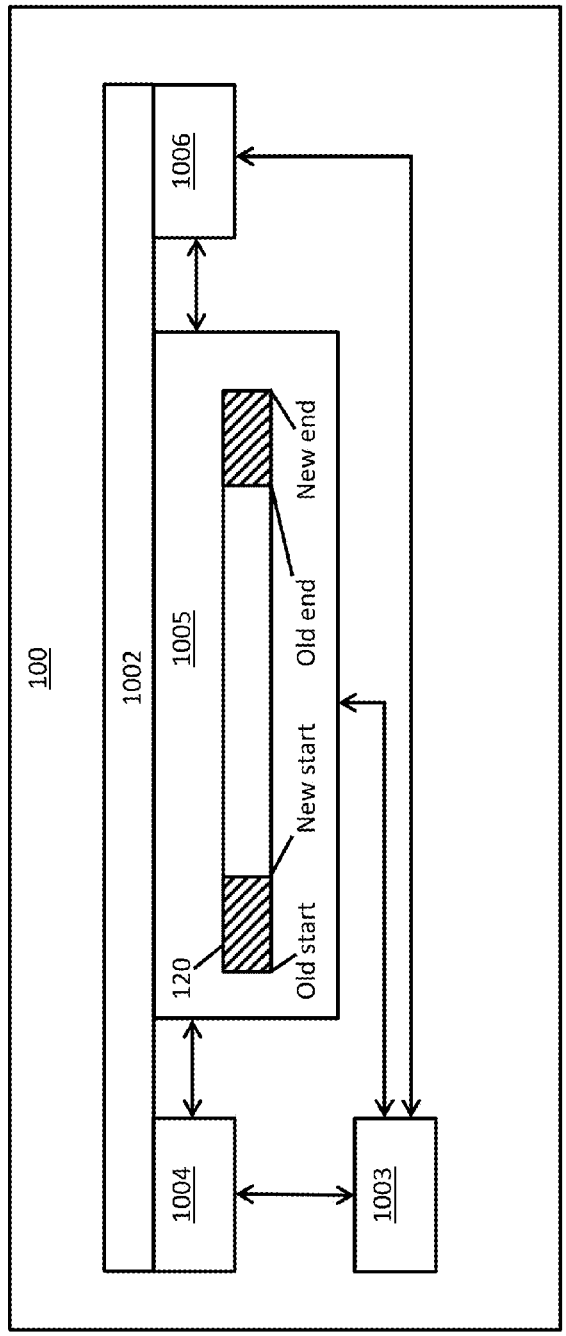
FIG. 4 is a schematic drawing of functionalities of the computer program product of FIG. 3.

With reference to FIGS. 3 and 4, the computer program product 100 includes a computer readable storage medium 1001 and may be installed in the memory unit 117 of the computing device 11 as firmware or as lower level executable program instructions. As such and, as shown in FIG. 4, the computer program product 100 defines a high-level software library wrapper 1002, a data compression analysis unit 1003, an accelerated compression unit 1004, an accelerated compression dictionary 1005 and a software compression unit 1006. The high-level software library wrapper 1002 manages data compression executions for the computing device 11 and is coupled to the accelerated compression unit 1004, the accelerated compression dictionary 1005 and the software compression unit 1006. The accelerated compression unit 1004 may be embodied in the hardware accelerator card 119 and the software compression unit 1006 may be embodied in the CPU 116. The data compression analysis unit 1003 manages data executions for the computing device 11 in accordance with the description provided below. The data compression analysis unit 1003 may be embodied in the CPU 116 and the accelerated compression dictionary 1005 may be embodied in the CPU 116, the hardware accelerator card 119 or another similar computing element.

The accelerated compression dictionary 1005 may be provided as a dictionary coder or as a substitution coder. In any case, the accelerated compression dictionary 1005 is formed of lossless data compression algorithms that operate by searching for matches between data to be compressed and a set of strings contained in a compression dictionary data structure 120 that is maintained by the accelerated compression dictionary 1005. When the accelerated compression dictionary 1005 finds a match, it substitutes a reference to the string's position in the data and thus avoids the need to copy and transfer the entirety of the matching data. In accordance with embodiments, the compression dictionary data structure 120 may be 32 KB from start to finish.

During operations of the accelerated compression dictionary 1005, the compression dictionary data structure 120 is initially empty or reset/zeroed. Over time, as more and more matching data strings are encountered, the compression dictionary data structure 120 is filled until it reaches maximum capacity. At this point, any further data strings to be added to the compression dictionary data structure 120 are added onto its end with the corresponding deletion of older data strings at the start.

Figure 5:
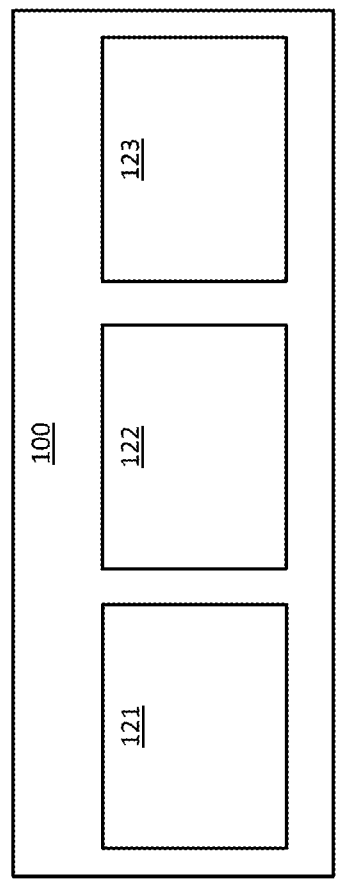
FIG. 5 is a schematic illustration of program instruction components of the computer program product of FIG. 3.

With reference to FIG. 5, the computer program product 100 includes first program instructions 121, second program instructions 122 and third program instructions 123. The first program instructions 121 cause the CPU 116 operate at least partially as the software compression unit 1006 to execute software compression for first data compression requests that have respective sizes below a predefined threshold. The second program instructions 122 cause the CPU 116 to forward second data compression requests having respective sizes above the predefined threshold to the hardware accelerator card 119 where those second data compression requests can be executed more efficiently than they could be executed by the software compression unit 1006. The third program instructions 123 cause the CPU 116 to maintain a persistence of the compression dictionary data structure 120 for use in the executions of the second data compression requests across the executions of both the first and second data compression requests.

In accordance with embodiments, the predefined threshold may be manually or automatically set. In the latter case, the predefined threshold is automatically set by taking into account at least one or both of historical compression request data and historical performance data of the hardware accelerator card 119. In general, the historical compression request data and historical performance data of the hardware accelerator card 119 may be considered in order to maintain an efficiency and throughput of the hardware accelerator card 119.

The first-third program instructions 121-123 are independent of the program library being used. Thus, any programming library that supports a hardware accelerator card and has a complementary software implementation can leverage the first-third program instructions 121-123. Moreover, the third program instructions 123 provide value as the compression dictionary data structure 120 of the accelerated compression dictionary 1005 is maintained even if a small request is processed with the software compression unit 1006 without the need for software to manipulate the accelerated compression dictionary 1005 in a potentially costly and error prone manner. In addition, the maintenance of the compression dictionary data structure 120 of the accelerated compression dictionary 1005 allows for better compression ratios for next large data compression requests.

In accordance with embodiments, the executions of the first data compression requests by the software compression unit 1006 may include at least one of compression performance with a limited look-back context to thereby reduce a memory footprint and a repackaging of request data into a copy block. In the latter case, the software compression unit 1006 does not compress data subject to the first data compression request but instead repackages the data into the copy block. Here, the data may be in a predefined format (e.g., a DEFLATE format) but continues to be in its raw non-compressed form. This repackaged data may be padded or not padded onto a byte boundary. In the latter case, repackaged data not padded onto a byte boundary needs to be tracked and, in some cases, manipulated by the software compression unit 1006.

In accordance with further embodiments, the executions of the first data compression requests by the software compression unit 1006 will not normally make use of or rely upon the compression dictionary data structure 120 of the accelerated compression dictionary 1005. However, in an event that a large set of the first data compression requests are determined to be processed, in the state of being processed or about to be processed, a full compression context could be setup so that lookbacks to the compression dictionary data structure 120 can be performed and such that compression ratio is not negatively impacted.

In accordance with embodiments, the maintenance of the persistence of the compression dictionary data structure 120 by the third program instructions 123 relates to various types of manipulations of the compression dictionary data structure 120 for future second data compression requests that are to be handled by the hardware accelerator card 119. In the simple case, the compression dictionary data structure 120 can be zeroed so it is effectively reset every time one of the first requests is processed by the software compression unit 1006. As an alternative to performing a dictionary reset, however, in an event there is a partially or fully populated compression dictionary data structure 120, the compression dictionary data structure 120 may be manipulated through an adjustment of the starting location thereof. A size of such adjustment may be equal or substantially similar to the size of the first request(s) handled by the software compression unit 1006.

Once the adjustment of the compression dictionary data structure 120 is completed, the size of the adjustment is provided to the hardware accelerator card 119. In this way, every back reference to the compression dictionary data structure 120 by the hardware accelerator card 119 can be altered as an offset. That is, as back references are found, the offset will be added to the distance of that back reference to obtain the actual location in the original file being compressed. The process can be repeated if there are multiple first requests executed by the software compression unit 1006 consecutively by keeping or maintaining a running sum of the sizes of the first requests and using that running sum as the offset value.

Figure 6:
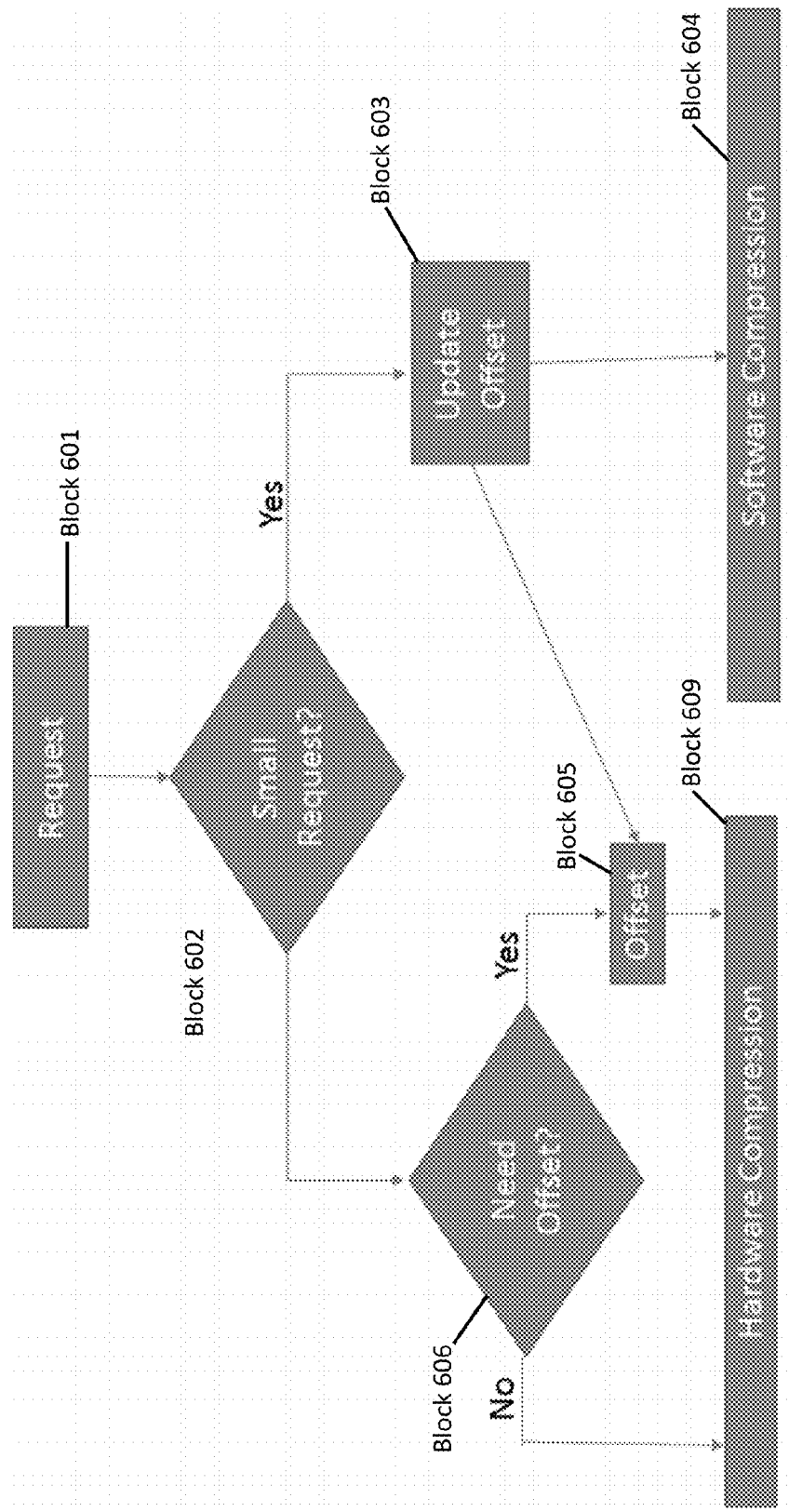
FIG. 6 is a flow diagram illustrating an operation of the computer program product of FIG. 3.

The processes laid out above will now be further described with reference to the flow diagram of FIG. 6. As shown in FIG. 6, a data compression request is received by the data compression analysis unit 1003 at block 601 and, at block 602, the data compression analysis unit 1003 determines whether the data compression request is a first (i.e., small) or second (i.e., large) data compression request. In an event the data compression request is a first data compression request, the first data compression request is forwarded to the software compression unit 1006 where an offset update (e.g., a size of an offset associated with the data compression request) is calculated at block 603 and software compression is executed at block 604 (by, e.g., compression with a limited look-back context or a repackaging of request data into a copy block with padding/tracking and manipulation) and from which the offset update information is sent to the hardware accelerator card 119 at block 605 in order to inform the hardware accelerator card 119 of the offset update.

On the other hand, in an event the data compression request is a second data compression request, the second data compression request is forwarded to the hardware accelerator card 119. Within the hardware accelerator card 119, it is determined whether execution of the second data compression request requires an offset or not at block 606. In an event that no offset is needed, execution of the second data compression request by the hardware accelerator card 119 commences at block 607. However, in an event that an offset is needed, execution of the second data compression request by the hardware accelerator card 119 proceeds by instituting the offset at block 608 and then executing the second data compression request by the hardware accelerator card 119 at block 609.

After the second data compression request using the padded compression dictionary data structure 120 is complete, the compression dictionary data structure 120 is re-primed for a next second data compression request. In the re-priming, it is to be understood that, if the previous second data compression request was 32 KB or larger, the padding space would naturally have been pushed out of the compression dictionary data structure 120 whereas, if the previous second data compression request was smaller than 32 KB, the compression dictionary data structure 120 can be truncated after current padding space and the next compression dictionary data structure 120 would be the size of the last request.

With this understood, the hardware accelerator card 119 may be configured to maintain the padding space in the compression dictionary data structure 120 and the software compression unit 1006 can pass back a list defined dictionary describing the areas, for example as a bit array, where each bit represented the validity of one or more bytes. This would allow for 'holes' to be present in the compression dictionary data structure 120.

While it is understood that the first-third program instructions 121-123 may be deployed by manual loading thereof directly into a client, server and/or proxy computer by way of a loadable storage medium, such as a CD, DVD, etc., or by being manually inserted into the computing device 11, the first-third program instructions 121-123 may also be automatically or semi-automatically deployed by being downloaded into client computers that will then execute the first-third program instructions 121-123. Alternatively, the first-third program instructions 121-123 may be sent directly to a client system via e-mail for detachment or loading into a directory or directly into a client computer hard drive. When there are proxy servers, loading processes will select proxy server codes, determine on which computers to place the proxy servers' codes, transmit the proxy server codes and then install the proxy server codes on proxy computers.

The first-third program instructions 121-123 will then be transmitted to the proxy server and subsequently stored thereon.

Figure 7:
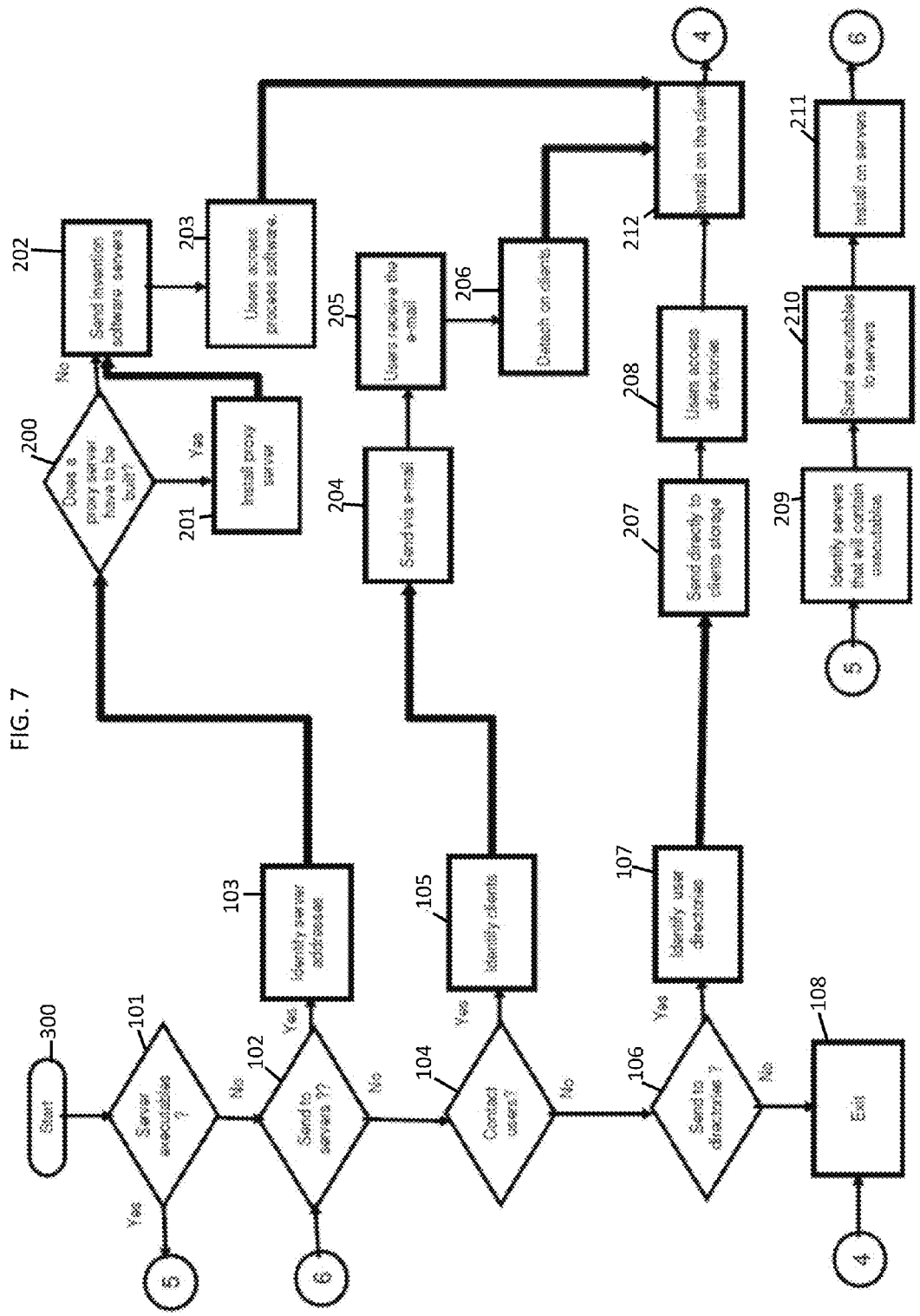
FIG. 7 is a flow diagram illustrating a deployment process of the computer pro gram pro duct.

In accordance with embodiments and, with reference to FIG. 7, a deployment process of the computer program product described above is provided. The process begins at block 300 and at block 101 with a determination of whether the first-third program instructions 121-123 will reside on servers when executed. If so, then the servers that are identified at block 209. The first-third program instructions 121-123 are then transferred directly to the servers' storage via FTP or some other protocol or by copying though the use of a shared file system at block 210 such that the first-third program instructions 121-123 are installed on the servers at block 211.

Next, a determination is made on whether the first-third program instructions 121-123 are to be deployed by having users access to the first-third program instructions 121-123 on servers at block 102. If so, the server addresses that will store the first-third program instructions 121-123 are identified at block 103 and a determination is made if a proxy server is to be built at block 200 for storage. A proxy server is a server that sits between a client application, such as a Web browser, and a real server and operates by intercepting all requests to the real server to see if it can fulfill the requests itself. If not, the proxy server forwards the request to the real server. The two primary benefits of a proxy server are to improve performance and to filter requests.

If a proxy server is required, then the proxy server is installed at block 201 and the first-third program instructions 121-123 are sent to the servers via a protocol, such as FTP, or by being copied directly from the source files to the server files via file sharing at block 202. Another embodiment involves sending a transaction to the (one or more) servers that contained the process software, and have the server process the transaction and then receive and copy the process software to the server's file system. Once the process software is stored at the servers, the users may then access the first-third program instructions 121-123 on the servers and copy to the same to their respective client computer file systems at block 203. Alternatively, the servers may automatically copy the first-third program instructions 121-123 to each client and then run an installation program for the first-third program instructions 121-123 on each client computer whereby the user executes the program that installs the first-third program instructions 121-123 on his client computer at block 212 and then exits the process at block 108.

At block 104, a determination is made as to whether the first-third program instructions 121-123 are to be deployed by being sent to users via e-mail. If a result of the determination is affirmative, the set of users are identified together with the addresses of the user client computers at block 105 and first-third program instructions 121-123 are sent via e-mail to each of the users' client computers, as shown at block 204. The users then receive the e-mail at block 205 and detach the first-third program instructions 121-123 from the e-mail to a directory on their client computers at block 206. The user executes the program that installs the first-third program instructions 121-123 on his client computer at block 212 and then exits the process at block 108.

Lastly, a determination is made on whether the first-third program instructions 121-123 will be sent directly to user directories on their client computers at block 106. If so, the user directories are identified at block 107 and the process software is transferred directly to the user's client computer directories at block 207. This can be done in several ways such as, but not limited to, sharing the file system directories and then copying from the sender's file system to the recipient user's file system or, alternatively, using a transfer protocol such as File Transfer Protocol (FTP). The users access the directories on their client file systems in preparation for installing the first-third program instructions 121-123 at block 208, execute the program that installs the first-third program instructions 121-123 at block 212 and then exit the process at block 108.

With reference to FIG. 8, a computer-implemented method for data compression is provided and includes executing software compression for first requests for data compression that have respective sizes below a predefined threshold at block 801, forwarding second requests for data compression having respective sizes above the predefined threshold to a hardware accelerator at block 802 and maintaining a persistence of a compression dictionary used for executing the second requests across executions of the first and second requests at block 803.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer program product for data compression, the computer program product comprising a computer readable storage medium having program instructions embodied therewith, the program instructions being readable and executable by a processing circuit to cause the processing circuit to:
   execute software compression for first requests for data compression that have respective sizes below a predefined threshold at the processing circuit;
   forward second requests for data compression having respective sizes above the predefined threshold to a hardware accelerator, which is configured to perform data compression faster than the processing circuit, and which is remote from the processing circuit whereby forwards of the second requests to the hardware accelerator are associated with time and processing costs that are amortizable by the predefined threshold being relatively large as compared to the respective sizes of the first requests;

maintain a persistence of a compression dictionary used for executing the second requests across executions of the first and second requests, wherein maintenance of compression dictionary persistence comprises:

padding a compression dictionary with padding space in accordance with a size of a first request;

adjusting a compression dictionary starting location by the size of the first request and keeping a running total of compression dictionary starting location adjustments each time a subsequent first request is executed and the compression dictionary is padded, and the program instructions further cause the processing circuit to inform the hardware accelerator of an offset in accordance with the running total of the compression dictionary starting location adjustments; and execute software compression for the second requests for data compression at the hardware accelerator with the offset.

2. The computer program product according to claim 1, wherein an execution of software compression for one or more of the first requests comprises one of:

compression performance with a limited look-back context; and a repackaging of request data into a copy block.

3. The computer program product according to claim 2, further comprising a tracking and manipulation of repackaged data.

4. The computer program product according to claim 1, wherein the program instructions further cause the processing circuit to re-prime the compression dictionary for a next second request.

5. A computer system for data compression, the computer system comprising a computer readable storage medium having instructions stored thereon that are executable by a processing circuit to cause the processing circuit to:

execute software compression for first requests for data compression that have respective sizes below a predefined threshold at the processing circuit;

forward second requests for data compression having respective sizes above the predefined threshold to a hardware accelerator, which is configured to perform data compression faster than the processing circuit, and which is remote from the processing circuit whereby forwards of the second requests to the hardware accelerator are associated with time and processing costs that are amortizable by the predefined threshold being relatively large as compared to the respective sizes of the first requests; and maintain a persistence of a compression dictionary used for executing the second requests across executions of the first and second requests, wherein maintenance of compression dictionary persistence comprises:

padding a compression dictionary with padding space in accordance with a size of a first request;

adjusting a compression dictionary starting location by the size of the first request and keeping a running total of compression dictionary starting location adjustments each time a subsequent first request is executed and the compression dictionary is padded, and the program instructions further cause:

the processing circuit to inform the hardware accelerator of an offset in accordance with the running total of the compression dictionary starting location adjustments; and the hardware accelerator to execute software compression for the second requests for data compression with the offset.

6. The computer system according to claim 5, wherein the hardware accelerator is embodied in a card element, which is removable from the computer system.

7. The computer system according to claim 5, wherein an execution of software compression for one or more of the first requests comprises one of:

compression performance with a limited look-back context; and a repackaging of request data into a copy block.

8. The computer system according to claim 7, further a tracking and manipulation of repackaged data.

9. The computer system according to claim 5, wherein the instructions further cause the processing circuit to re-prime the compression dictionary for a next second request.

* * * * *